United States Patent
Zhao et al.

(10) Patent No.: US 8,388,819 B2
(45) Date of Patent: Mar. 5, 2013

(54) MAGNET TARGET AND MAGNETRON SPUTTERING APPARATUS HAVING THE SAME

(75) Inventors: Xin Zhao, Beijing (CN); Wenyu Zhang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 447 days.

(21) Appl. No.: 12/703,302

(22) Filed: Feb. 10, 2010

(65) Prior Publication Data

US 2010/0206726 A1    Aug. 19, 2010

(30) Foreign Application Priority Data

Feb. 13, 2009    (CN) .......................... 2009 1 0078077

(51) Int. Cl.
   *C23C 14/34*    (2006.01)
(52) U.S. Cl. ........... 204/298.2; 204/298.16; 204/298.17; 204/298.19
(58) Field of Classification Search ............. 204/298.16, 204/298.17, 298.19, 298.2
   See application file for complete search history.

(56) References Cited

U.S. PATENT DOCUMENTS

| | | | | |
|---|---|---|---|---|
| 4,657,616 | A * | 4/1987 | Benzing et al. .......... | 156/345.43 |
| 5,417,833 | A * | 5/1995 | Harra et al. ................ | 204/298.2 |
| 6,440,282 | B1 * | 8/2002 | Wada et al. ................ | 204/298.2 |
| 2005/0252768 | A1 | 11/2005 | Bangert et al. | |
| 2005/0274610 | A1 | 12/2005 | Iseki | |
| 2008/0067062 | A1 | 3/2008 | Deppisch et al. | |
| 2008/0283394 | A1 | 11/2008 | Zhang | |
| 2009/0205949 | A1 * | 8/2009 | Zueger ..................... | 204/192.12 |
| 2009/0236221 | A1 | 9/2009 | Zhang et al. | |

FOREIGN PATENT DOCUMENTS

| | | |
|---|---|---|
| CN | 1693532 A | 11/2005 |
| CN | 1861836 A | 11/2006 |
| CN | 201068469 Y | 6/2008 |
| CN | 201162043 Y | 12/2008 |

(Continued)

OTHER PUBLICATIONS

USPTO NFOA mailed Jun. 8, 2011 in connection with U.S. Appl. No 12/098,167.
USPTO NFOA mailed Jun. 21, 2011 in connection with U.S. Appl. No. 12/267,709.
USPTO FOA mailed Oct. 4, 2011 in connection with U.S. Appl. No. 12/267,709.
USPTO FOA mailed Nov. 7, 2011 in connection with U.S. Appl. No. 12/098,167.
USPTO AA mailed Jan. 4, 2012 in connection with U.S. Appl. No. 12/267,709.

*Primary Examiner* — Keith Hendricks
*Assistant Examiner* — Jason M Berman
(74) *Attorney, Agent, or Firm* — Ladas & Parry LLP

(57) ABSTRACT

A magnet target comprising a fixing plate, a plurality of shafts arranged in an array, a plurality of connecting rods pivotably provided onto a plate surface of the fixing plate at one end and capable of rotating about corresponding one of the shafts, and a plurality of magnets that are each attached to the other fee end of one connecting rod. The magnets comprise magnets having external S poles and magnets having external N poles, and the magnets having external S poles and magnets having external N poles are arranged alternatively in an array.

19 Claims, 5 Drawing Sheets

FOREIGN PATENT DOCUMENTS

| | | |
|---|---|---|
| JP | 63-125675 A | 5/1988 |
| JP | 63-307270 A | 12/1988 |
| JP | 02205673 A * | 8/1990 |
| JP | 5-507765 A | 11/1993 |
| JP | 11-080948 A | 3/1999 |
| JP | 2000-309867 A | 11/2000 |
| JP | 2001-254175 A | 9/2001 |
| JP | 2001-288566 A | 10/2001 |
| JP | 2005-336520 A | 12/2005 |
| JP | 2007-238978 A | 9/2007 |
| JP | 2009-068103 A | 4/2009 |
| JP | 2009068103 A * | 4/2009 |
| KR | 1020000014681 A | 3/2000 |
| WO | 91/20091 A | 12/1991 |

* cited by examiner

MAGNET TARGET AND MAGNETRON SPUTTERING APPARATUS HAVING THE SAME

BACKGROUND

The present invention relates to a magnet target and a magnetron sputtering apparatus having the same.

During a process of magnetron sputtering, ionization degree of sputtering gas is relatively high to obtain a relatively high depositing rate of sputtering target, and in turn, to obtain a relatively high ionization degree of sputtering gas, a sufficiently large collision probability between electrons and sputtering gas molecules should be guaranteed. Accordingly, a magnet target is used in a magnetron sputtering apparatus to control electron trajectory in a helical form (as shown in FIG. 1).

When an electron travels in a magnetic field, the electron is subject to Lorentz force due to an angle between the velocity of the electron and the direction of the magnetic field and thus trends to conduct a circular motion. Furthermore, due to the presence of an electric field, the electron has acceleration in the direction opposite to that of the electric field. As a result, the electron moves forward helically under the action of both the magnetic field and the electric field. In this way, the motion path of the electron is elongated, and in turn the collision probability of the electron with the sputtering gas molecules is enhanced.

At present, most magnet targets adopt bar-like permanent magnets to provide a magnetic field for sputtering. As shown in FIGS. 2 and 3, a plurality of bar-like permanent magnets in a magnet target are fixed onto a fixing plate 3 side by side, including bar-like permanent magnets 1 having an internal N pole and an external S pole and bar-like permanent magnets 2 having an internal S pole and an external N pole. The bar-like permanent magnets 1 and 2 are arranged alternately. The magnetic field distribution characteristics of the bar-like permanent magnets fixed in the magnet target bring about a magnetic field having a non-uniform magnetic induction strength parallel to sputtering target in the magnetron sputtering region. Effects of Lorentz force on the electrons at different positions in the non-uniform magnetic field are different. If the magnetic induction strength is larger at a position, the cycle of the circular motion of an electron is smaller; as a result, a helical motion is more obvious and accordingly the probability that electrons and sputtering gas molecules collide with each other to ionize the sputtering gas molecules at the position is relatively larger. As shown in FIG. 4, the probability that sputtering target corresponding to a region where relatively larger magnetic induction strength presents is bombarded by the sputtering gas molecules is larger than the probability that the sputtering target in the remaining region is bombarded by sputtering gas molecules, which causes obvious local consumption of sputtering target and severe reduction of lifespan of sputtering target.

When a magnet moves at a uniform velocity, the magnetic induction strength generated per unit time in the region covered by the motion track of the magnet is substantively constant. Accordingly, based on this principle, there are proposed several approaches for improving uniformity of magnetic induction strength by moving magnet target to traverse the problem of obvious local consumption of sputtering target in a magnetron sputtering apparatus.

As shown in FIGS. 5 and 6, a plurality of bar-like permanent magnets 1 having internal N poles and external S poles and a plurality of bar-like permanent magnets 2 having internal S poles and external N poles are arranged alternately and fixed side by side onto two bar-like fixing plates 3 perpendicular to the permanent magnets 1 and 2. The fixing plates 3 reciprocate along the plane parallel to the sputtering target, so that the uniformity of the magnetic induction strength in the magnetron sputtering region can be improved. However, as during the motion of the magnet target, the speed of the magnet target varies; the maximum speed appears at the middle of the motion path and the minimum speed at edges. The uniformity of the magnetic induction strength in the central region of the sputtering target can be improved while the uniformity of the magnetic induction strength of the marginal portion of the sputtering target has a limited improvement only. Therefore, with this improving approach, the problem of obvious local consumption in the middle of a sputtering target can only be partially solved, while local consumption in the marginal portion of the sputtering target remains serious.

In addition to the above described approach, there is another approach for addressing the problem of obvious local consumption of sputtering target as follows.

As shown in FIGS. 7 and 8, a plurality of bar-like permanent magnets 1 having internal N poles and external S poles and a plurality of bar-like permanent magnets 2 having internal S poles and external N poles are arranged alternately and fixed side by side onto an endless belt 4 rotating at a constant speed and thus conduct a periodical motion parallel to a plane of sputtering target, so that a magnetic field of relatively uniform magnetic induction strength is generated in a magnetron sputtering region. This approach improves not only uniformity of magnetic induction strength in the central region of sputtering target but also uniformity of magnetic induction strength in marginal portion of the sputtering target. However, this approach improves mainly the uniformity in the movement direction of sputtering target, while uniformity of magnetic field in the direction perpendicular to the movement direction is almost not improved.

SUMMARY

An embodiment of the invention provides a magnet target comprising a fixing plate, a plurality of shafts arranged in an array, a plurality of connecting rods pivotably provided onto a plate surface of the fixing plate at one end and capable of rotating about corresponding one of the shafts, and a plurality of magnets that are each attached to the other fee end of one connecting rod. The magnets comprise magnets having external S poles and magnets having external N poles, and the magnets having external S poles and magnets having external N poles are arranged alternatively in an array.

Another embodiment of the invention provides a magnetron sputtering apparatus a sputtering target, a back plate, and a magnet target. The sputtering target is fixed to one side of the back plate and the magnet target is attached to the other side of the back plate. The magnet target comprising a fixing plate, a plurality of shafts arranged in an array, a plurality of connecting rods pivotably provided onto a plate surface of the fixing plate at one end and capable of rotating about corresponding one of the shafts, and a plurality of magnets that are each attached to the other fee end of one connecting rod. The magnets comprise magnets having external S poles and magnets having external N poles, and the magnets having external S poles and magnets having external N poles are arranged alternatively in an array.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Embodiments of the present invention provide a magnet target and a magnetron sputtering apparatus having the same, which can mitigate obvious local consumption of sputtering target in a magnetron sputtering apparatus.

First Embodiment

Figure 1:
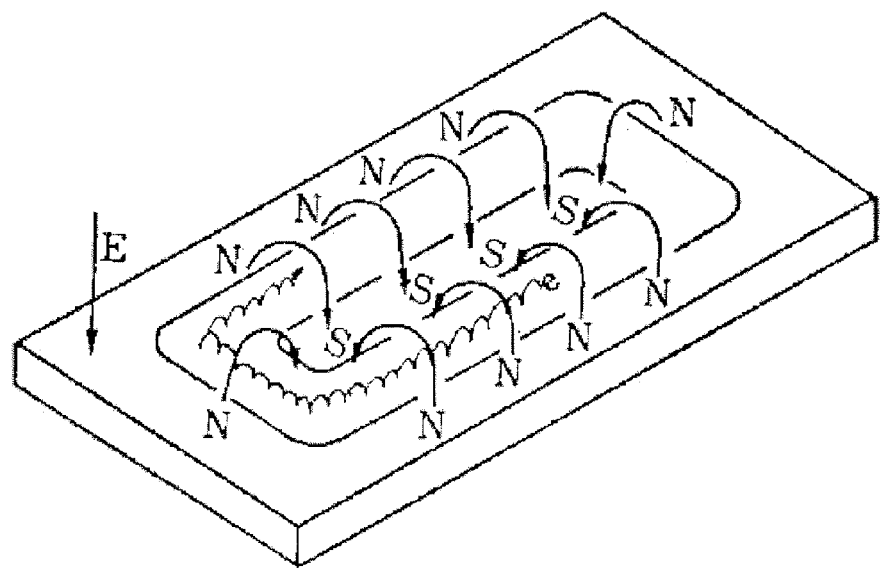
FIG. 1 is a schematic illustration of a motion track of an electron in a magnetron sputtering apparatus.
Figure 2:
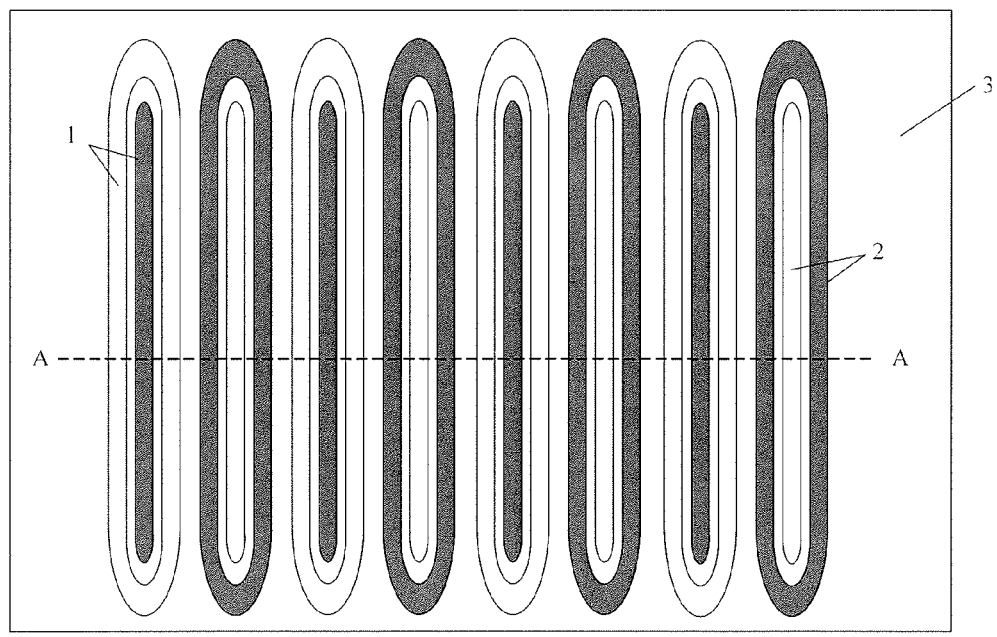
FIG. 2 is a plane view of a stationary magnet target structure.
Figure 3:
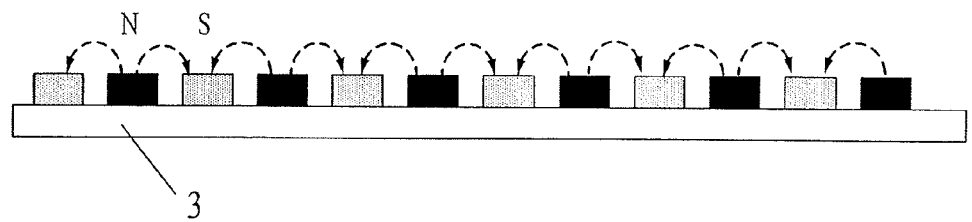
FIG. 3 is a sectional view taken along line A-A of the magnet target structure shown in FIG. 2.
Figure 4:
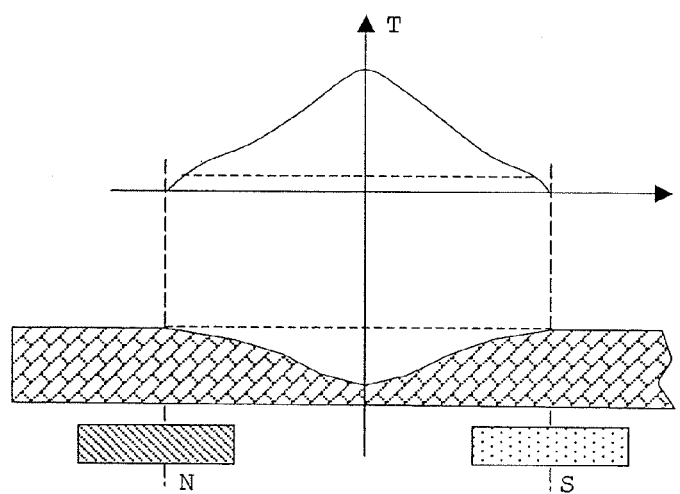
FIG. 4 is a schematic illustration of local consumption of sputtering target in a magnetron sputtering apparatus.
Figure 5:
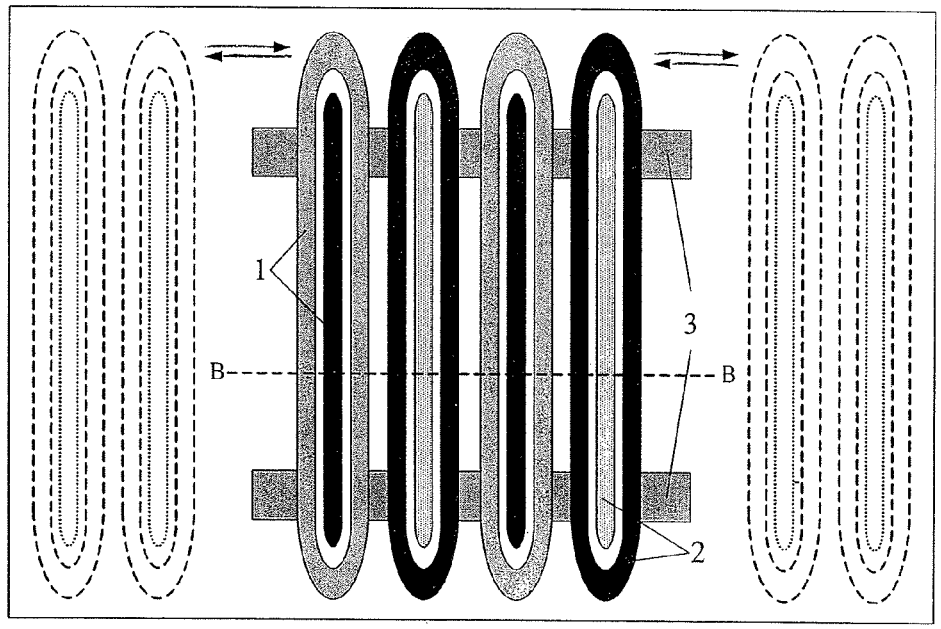
FIG. 5 is a plane view of a magnet target structure capable of reciprocating.
Figure 6:
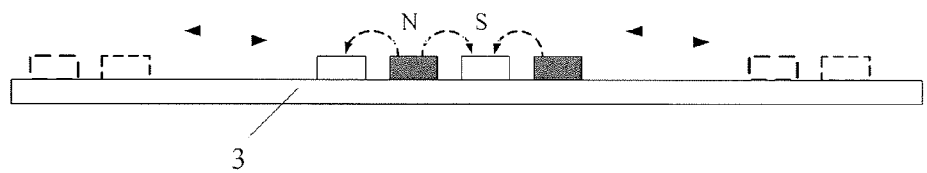
FIG. 6 is a sectional view taken along line B-B of the magnet target structure shown in FIG. 5.
Figure 7:
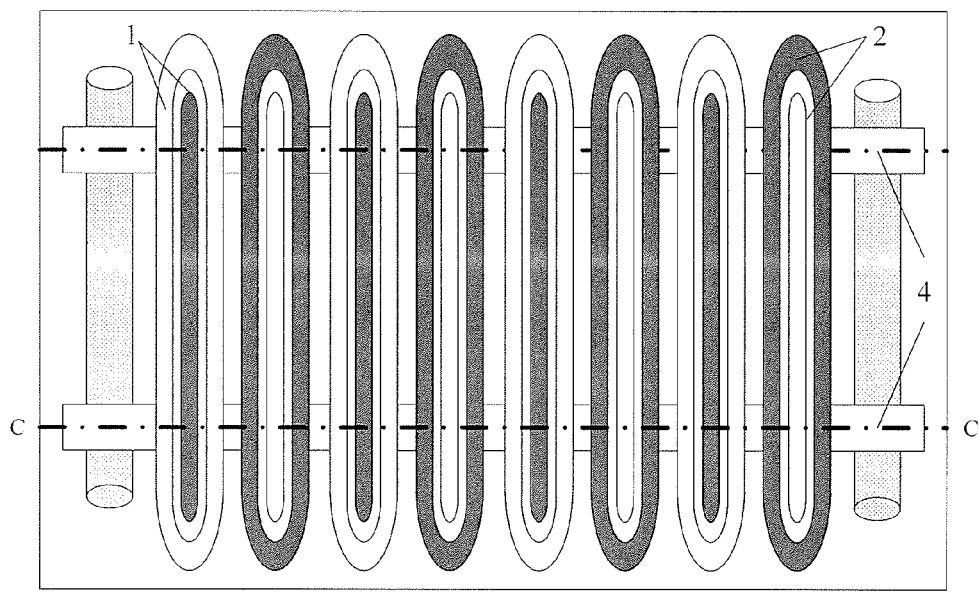
FIG. 7 is a plane view of a endless-belt-typed magnetron sputtering structure.
Figure 8:
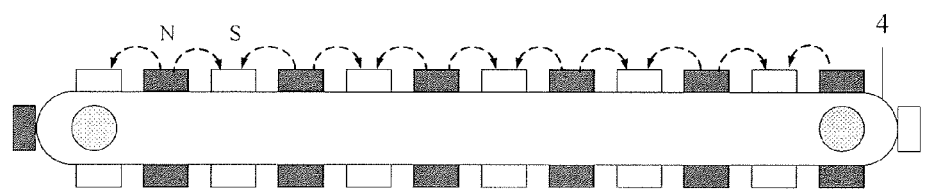
FIG. 8 is a sectional view taken along line C-C of the magnet target structure shown in FIG. 7.
Figure 9:
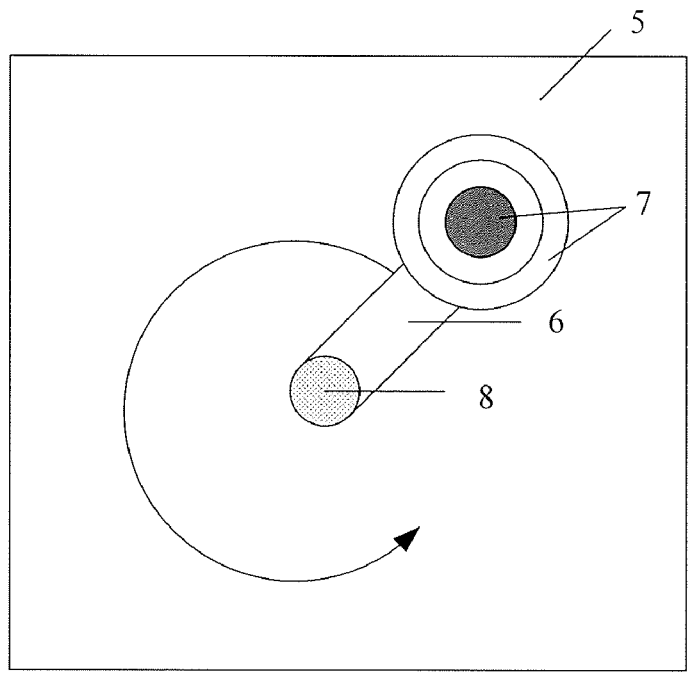
FIG. 9 is a partial plane view of a magnet target structure of an embodiment of the present invention.

FIG. 9 is a partial schematic view of the magnet target structure of the magnetron sputtering apparatus provided by this embodiment of the present invention. The magnet target structure each comprises a fixing plate 5, connecting rods 6 and magnets 7. The connecting rods 6 are pivotably provided on a surface of the fixing plate 5 and can turn around about respective shafts 8. The plurality of shafts 8 are arranged in an array on the plate surface of the fixing plate 5, and the free end of each connecting rod 6 is connected with the respective magnet 7. The magnets 7 comprise magnets having a central N pole and an external S pole (referred to as magnets having an external S pole hereinafter) and magnets having a central S pole and an external N pole (referred to as magnets having an external N pole hereinafter). These magnets 7 are arranged alternately in the two directions perpendicular to each other.

Among others, the magnets 7 may be circular magnets; accordingly, the above mentioned magnet having an external S pole is a circular magnet having a central N pole and an external S pole, and the above mentioned magnet having an external N pole is a circular magnet having a central S pole and an external N pole.

Further, the attachment mechanism between the connecting rods 6 and the circular magnets 7 can be soldering or pin joint with shafts. Since the magnets 7 used in this embodiment of the present invention can be circular magnets, the circular magnets can be soldered to the connecting rods 6.

Figure 10:
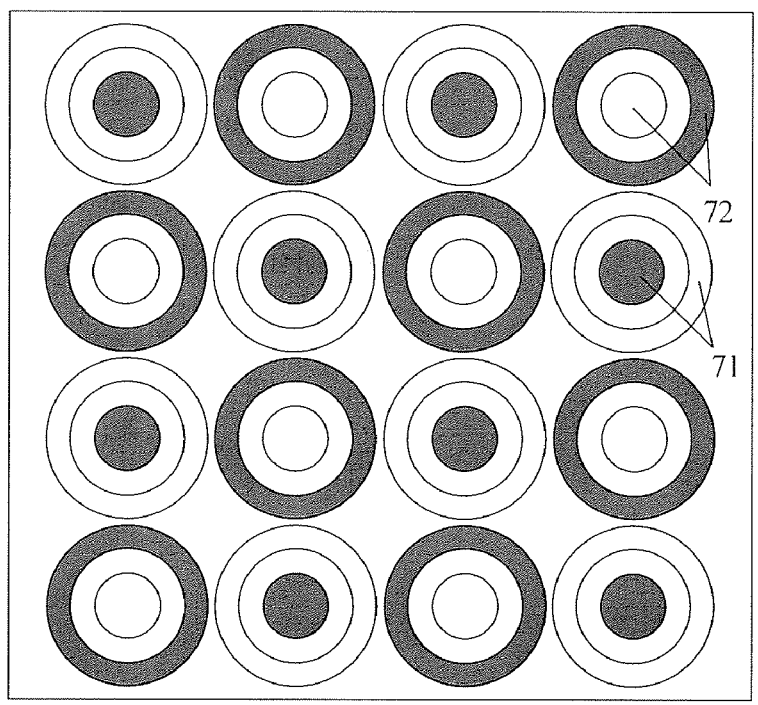
FIG. 10 is a schematic diagram of a magnet array of an embodiment of the present invention.

Since the shafts 8 are arranged in an array on the fixing plate 5, the circular magnets 7 attached to the free ends of the connecting rods 6 are also arranged in a corresponding array as shown in FIG. 10. Each row of the magnet array comprises at least one magnet 71 having an external S pole and one magnet 72 having an external N pole; each column of the magnet array comprises at least one magnet 71 having an external S pole and one magnet 72 having an external N pole.

In order to provide a magnetic field with more uniform magnetic induction strength in the magnetron sputtering region of a magnetron sputtering apparatus, it is required that, in the magnet target of this embodiment, each circular magnet 7 conducts circular motion with uniform speed about one fixed point where the shaft 8 connects the connecting rod 6 and the fixing plate 5. Thus, the magnetic induction strength of the magnetic field generated per unit time by each magnet in the region covered by the rotation of the magnet is substantially the same, and a magnetic field of relatively uniform magnetic induction strength can be generated in the magnetron sputtering region.

In this embodiment, the initial positions of the connecting rods of all the circular magnets are the same, thus the connecting rods of all the circular magnets can be in synchronism all along during rotating with uniform speed.

In this embodiment, the size of the fixing plate 5, the radius of the circular magnets 7, the length of the connecting rods 6 and the gap between every two circular magnets can be considered along with the size and component of the sputtering target, ensuring that the sputtering target is within the magnetic field provided by the magnet target all along when the circular magnets of the magnet target conduct circular motion with uniform speed.

In the magnet target provided in the present embodiment, each circular magnet conducts circular motion with uniform speed about a fixed point and the speed of each point on the same magnet is kept the same during the motion, thus the magnetic induction strength of the magnetic field generated per unit time by each circular magnet in the region covered by its rotation is substantially the same, so that a more uniform magnetic field in the magnetron sputtering region can be provided. Moreover, the magnets of the magnet target of the present embodiment conduct circular motion with uniform speed, thus the magnetic induction strength in both directions perpendicular to each other in the plane parallel to sputtering target can be improved.

Second Embodiment

In this embodiment, on the basis of the magnet target of the first embodiment, the circular permanent magnets used in the magnet target are substituted with circular electromagnets, and the circular electromagnets comprise circular electromagnets having central N poles and external S poles (referred to as electromagnet having an external S pole hereinafter) and circular electromagnets having central S poles and external N poles (referred to as electromagnet having an external N pole hereinafter), which are arranged alternately in two directions perpendicular to each other.

The circular electromagnets can be soldered to the free ends of the connecting rods 6. Since the shafts 8 are arranged in an array on the fixing plate 5, the circular electromagnets attached to the free ends of the connecting rods 6 also form an electromagnet array. Each row of the electromagnet array comprises at least one electromagnet having an external S pole and one electromagnet having an external N pole; and each column of the electromagnet array comprises at least one electromagnet having an external S pole and one electromagnet having an external N pole.

In the above described electromagnet array, all the circular electromagnets are controlled by individual power supplies, respectively. Thus, independent control on each circular electromagnet, such as adjusting current for a certain one of the circular electromagnets, can be easily carried out, so that amplitude of magnetic induction strength corresponding to a certain region on sputtering target can be adjusted correspondingly.

In the present embodiment of the invention, the size of the fixing plate, the radius of the circular electromagnets, the length of the connecting rods, the gap between every two circular electromagnets and initial amplitudes of current for circular electromagnet coils can be considered along with the size and substance of the sputtering target, and all the parameters make the sputtering target within the magnetic field provided by the magnet target all along when the circular electromagnets of the magnet target conduct circular motion with uniform speed.

In the magnet target provided in the present embodiment, circular electromagnets are used to provide magnetic field for the magnetron sputtering region, and each circular electromagnet conducts circular motion with uniform speed about a fixed point and the speed of each point on the same electromagnet is kept the same during the motion, thus magnetic induction strength of the magnetic field generated per unit time by each circular electromagnet in the region covered by its rotation is substantially the same, so that a more uniform magnetic field in the magnetron sputtering region can be provided.

Furthermore, in the magnet target of the present embodiment, current for coils of a certain circular electromagnet can also be adjusted to control magnetic induction strength generated by such circular electromagnet. This can not only more efficiently adjust the distribution of the magnetic field of the magnetron sputtering region, for obtaining a magnetic field of uniform magnetic induction strength and therefore leading to uniform consumption of sputtering target and elongation of lifespan of the sputtering target, but also make it possible to eliminate variations in the evenness of deposited film due to uneven distance between sputtering target and a glass substrate in a sputtering chamber or unevenness in distribution of sputtering gas in the sputtering chamber by adjusting current in coils of a circular electromagnet(s) in a certain region according to evenness of currently deposited film, therefore further improving the quality of products.

Third Embodiment

Figure 11:
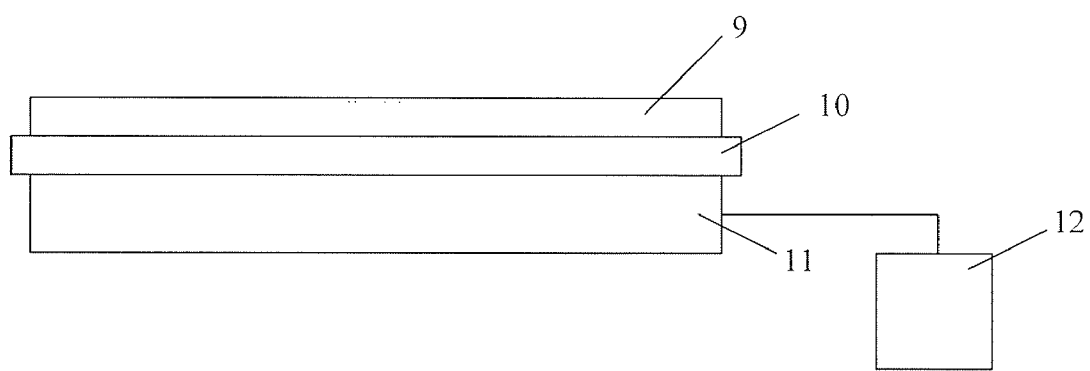
FIG. 11 is a structural schematic diagram of a magnetron sputtering apparatus of an embodiment of the present invention.

A magnetron sputtering apparatus containing the above described magnet target is further provided in this embodiment of the invention. As shown in FIG. 11, the apparatus comprises a sputtering target 9, a back plate 10 and a magnet target 11. On one side of the back plate 10 is fixed the sputtering target 9, and on the other side is attached the magnet target 11. The magnetron sputtering apparatus of the present embodiment of the invention will be described in more details with reference to FIGS. 9 and 10. Connecting rods 6 capable of rotating about shafts 8 are pivotably provided on a plate surface of a fixing plate 5 of the magnet target 11, the shafts 8 are arranged in an array on the plate surface of the fixing plate 5, and each of magnets 7 is attached to the free end of the corresponding connecting rod 6. The magnets 7 comprises magnets 71 having central N poles and external S poles (referred to as magnet having an external S pole hereinafter) and magnets 72 having central S poles and external N poles (referred to as magnet having an external N pole hereinafter), which are arranged alternately in two directions perpendicular to each other.

Among others, the magnets 7 may be circular magnets; accordingly, the above mentioned magnet having an external S pole is a circular magnet having a central N pole and an external S pole, and the above mentioned magnet having an external N pole is a circular magnet having a central S pole and an external N pole.

Further, the attachment mechanism between the connecting rods 6 and the circular magnets 7 can be soldering or pin joint with shafts. Since the magnets used in embodiments of the present invention are circular magnets, the circular magnets can be soldered to the connecting rods.

Since the shafts 8 are arranged in an array on the fixing plate 5, the circular magnets 7 attached to the free ends of the connecting rods 6 are also arranged in a magnet array. Each row of the magnet array comprises at least one magnet 71 having an external S pole and one magnet 72 having an external N pole; each column of the magnet array comprises at least one magnet 71 having an external S pole and one magnet 72 having an external N pole.

In order to provide a magnetic field with more uniform magnetic induction strength in a magnetron sputtering region of a magnetron sputtering apparatus, it is required that, in the magnet target of this embodiment, each circular magnet conducts circular motion with uniform speed about one fixed point where the shaft 8 connects the connecting rod 6 and the fixing plate 5. Thus, magnetic induction strength of the magnetic field generated per unit time by each magnet in the region covered by the rotation of the magnet is substantially the same, thus a magnetic field of relatively uniform magnetic induction strength is generated in the magnetron sputtering region.

Further, the initial positions of all connecting rods of all the circular magnets in the magnetron sputtering apparatus of the embodiment are the same, and the magnetron sputtering apparatus of the embodiment of the invention further comprises a drive unit 12, which controls direction and speed of rotation of all the connecting rods to keep them in synchronism all along during the rotation.

In the magnetron sputtering apparatus provided in the present embodiment, each circular magnet conducts circular motion with uniform speed about a fixed point and the speed of each point on the same magnet is kept the same during the motion, thus the magnetic induction strength generated per unit time by each circular magnet in the region covered by its rotation is substantially the same, and thus a more uniform magnetic field in a magnetron sputtering region can be provided. Moreover, the magnets in the magnet target of the embodiment conduct circular motion with uniform speed, thus the magnetic induction strength in both two directions perpendicular to each other in the plane parallel to sputtering target can be improved.

Four Embodiment

In this embodiment, on the basis of the magnetron sputtering apparatus of the third embodiment, the circular permanent magnets used in the magnetron sputtering apparatus are substituted with circular electromagnets to provide a magnetic field. The circular electromagnets comprise electromagnets having external S poles and electromagnets having external N poles.

In the magnetron sputtering apparatus of the present embodiment, the circular electromagnets of the magnet target can be soldered to free ends of the connecting rods 6. Since the shafts 8 are arranged in an array on the fixing plate 5, the circular electromagnets attached to the free ends of the connecting rods 6 also form an electromagnet array. Each row of the electromagnet array comprises at least one electromagnet having an external S pole and one electromagnet having an external N pole; each column of the electromagnet array comprises at least one electromagnet having an external S pole and one electromagnet having an external N pole.

In the above described electromagnet array, all the circular electromagnets can be connected to output terminals of individual power supplies, respectively. Thus, independent control of each circular electromagnet, such as adjusting current for a certain one of the circular electromagnets, can be easily carried out, so that amplitude of magnetic induction strength corresponding to a certain region on sputtering target can be adjusted.

In the magnetron sputtering apparatus provided in the present embodiment, circular electromagnets in the magnet target are used to provide magnetic field for a magnetron sputtering region, each circular electromagnet conducts circular motion with uniform speed about a fixed point and the speed of each point on the same electromagnet is kept the same during the motion, thus magnetic induction strength generated per unit time by each circular electromagnet in the region covered by its rotation is substantially the same, so that it is possible to provide a more uniform magnetic field in the magnetron sputtering region.

Furthermore, in the magnetron sputtering apparatus of the present embodiment, current for coils of a certain circular electromagnet can also be adjusted to control magnetic induction strength generated by this circular electromagnet. This can not only more efficiently adjust the distribution of a magnetic field of the magnetron sputtering region, for obtaining a magnetic field of uniform magnetic induction strength and therefore leading to uniform consumption of sputtering target and elongation of lifespan of the sputtering target, but also make it possible to eliminate variations in the evenness of the film due to uneven distance between sputtering target and a glass substrate in a sputtering chamber or unevenness in distribution of sputtering gas in the sputtering chamber by adjusting current in coils of a circular electromagnet(s) in a certain region according to evenness of currently deposited film, therefore further improving the quality of products.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A magnet target comprising:
a fixing plate,
a plurality of shafts arranged in an array;
a plurality of connecting rods arranged in an array pivotably provided onto a plate surface of the fixing plate at one end and capable of rotating about corresponding one of the shafts, and
a plurality of magnets that are each attached to the other free end of each one of the connecting rods, wherein the magnets comprise magnets each having a central N pole and an external S pole or magnets each having a central S pole and an external N pole, and the magnets each having a central N pole and an external S pole and magnets each having a central S pole and an external N pole are arranged alternatively in a corresponding array.

2. The magnet target of claim 1, wherein the magnets are circular magnets.

3. The magnet target of claim 1, wherein the magnets are soldered to the other free ends of the connecting rods.

4. The magnet target of claim 1, wherein the magnets are pin-jointed to the other free ends of the connecting rods.

5. The magnet target of claim 1, wherein the magnets are arranged in an array of at least two rows and at least two columns.

6. The magnet target of claim 1, wherein the magnets are electromagnets.

7. The magnet target of claim 6, wherein current of coils in each electromagnet is individually controlled.

8. The magnet target of claim 2, wherein the magnets are electromagnets.

9. The magnet target of claim 8, wherein current of coils in each electromagnet is individually controlled.

10. A magnetron sputtering apparatus comprising:
a sputtering target,
a back plate, and
a magnet target, wherein the sputtering target is fixed to one side of the back plate and the magnet target is attached to the other side of the back plate, and
wherein the magnet target comprises:
a fixing plate,
a plurality of shafts arranged in an array;
a plurality of connecting rods arranged in an array pivotably provided onto a plate surface of the fixing plate at one end and capable of rotating about corresponding one of the shafts, and
a plurality of magnets that are each attached to the other free end of each one of the connecting rods, wherein the magnets comprise magnets each having a central N pole and an external S pole or magnets each having a central S pole and an external N pole, and the magnets each having a central N pole and an external S pole and magnets each having a central S pole and an external N pole are arranged alternatively in an array.

11. The magnetron sputtering apparatus of claim 10, wherein the magnets are circular magnets.

12. The magnetron sputtering apparatus of claim 10, wherein the magnets are soldered to the other free ends of the connecting rods.

13. The magnetron sputtering apparatus of claim 10, wherein the magnets are pin-jointed to the other free ends of the connecting rods.

14. The magnetron sputtering apparatus of claim 10, wherein the magnets are arranged in an array of at least two rows and at least two columns.

15. The magnetron sputtering apparatus of claim 10, wherein the magnets are electromagnets.

16. The magnetron sputtering apparatus of claim 15, wherein current of coils of each electromagnet is controlled by individual power supplies.

17. The magnetron sputtering apparatus of claim 11, wherein the magnets are electromagnets.

18. The magnetron sputtering apparatus of claim 17, wherein current of coils of each electromagnet is controlled by individual power supplies.

19. The magnetron sputtering apparatus of claim 10, further comprising a drive unit, which controls all the connecting rods to keep in synchronism all along during rotation of the connecting rods.

* * * * *